US012790679B2

(12) United States Patent
Ahn et al.

(10) Patent No.: US 12,790,679 B2
(45) Date of Patent: Nov. 10, 2026

(54) DEPOSITION DEVICE

(71) Applicant: Samsung Display Co., LTD., Yongin-si (KR)

(72) Inventors: Jung Hyun Ahn, Yongin-si (KR); Jaesuk Moon, Yongin-si (KR); Seung Jin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 814 days.

(21) Appl. No.: 18/311,389

(22) Filed: May 3, 2023

(65) Prior Publication Data

US 2024/0026519 A1 Jan. 25, 2024

(30) Foreign Application Priority Data

Jul. 21, 2022 (KR) ........................ 10-2022-0090394

(51) Int. Cl.
*C23C 14/04* (2006.01)
*C23C 16/04* (2006.01)
*H01F 7/02* (2006.01)

(52) U.S. Cl.
CPC .......... *C23C 14/042* (2013.01); *C23C 16/042* (2013.01); *H01F 7/02* (2013.01)

(58) Field of Classification Search
CPC ........ C23C 14/12; C23C 14/042; C23C 14/50
See application file for complete search history.

(56) References Cited

U.S. PATENT DOCUMENTS

2010/0025237 A1* 2/2010 Kim ...................... C23C 14/042 204/298.18
2016/0104561 A1* 4/2016 Noh ........................ H01F 7/021 427/127

FOREIGN PATENT DOCUMENTS

KR 10-0532397 1/2006
KR 10-2194821 12/2020
KR 10-2246293 4/2021
KR 10-2021-0072601 6/2021

* cited by examiner

*Primary Examiner* — Joseph A Miller, Jr.
(74) *Attorney, Agent, or Firm* — CANTOR COLBURN LLP

(57) ABSTRACT

A deposition device includes a magnet portion including a plurality of magnets, and a substrate support that supports a substrate and faces the magnet portion. The substrate support includes a plurality of holes, and each of the plurality of holes is disposed on the substrate support corresponding to a space between corresponding adjacent ones of the plurality of magnets.

20 Claims, 14 Drawing Sheets

DEPOSITION DEVICE

CROSS-REFERENCE TO RELATED APPLICATION(S)

This application claims priority to and the benefits of Korean Patent Application No. 10-2022-0090394 under 35 U.S.C. § 119, filed on Jul. 21, 2022, in the Korean Intellectual Property Office (KIPO), the entire contents of which are incorporated herein by reference.

BACKGROUND

1. Technical Field

The disclosure relates to an organic material deposition device.

2. Description of the Related Art

A process of manufacturing semiconductor devices such as various display devices includes a process of depositing a layer on a substrate. The deposition process is mainly carried out in a vacuum chamber, and a deposition mask for limiting a region to be deposited on the substrate is disposed on the substrate.

As an example of a semiconductor device, a display device may include two electrodes formed on a substrate and an emission layer positioned therebetween to form a light emitting element. Electrons injected from an electrode of the light emitting element and holes injected from another electrode are combined in an organic emission layer to form excitons. As the exciton changes from an exited state to a ground state, it can emit energy and emit light.

The display device may include multiple pixels that can emit light of different colors, and each pixel may include a light emitting element.

An emission layer of the light emitting element may include an organic material that emits light of a primary color represented by different pixels. In addition, in the display device, various insulation layers and an encapsulation layer may be formed of organic materials. For the deposition of such organic layers, a deposition mask having an opening may be disposed on the substrate. The deposition mask may be a metal mask containing a metal. A magnet may be used to proceed with the deposition process by adhering the deposition mask to the substrate.

The above information disclosed in this Background section is only for enhancement of understanding of the disclosure, and therefore it may contain information that does not form the prior art that is already known in this country to a person of ordinary skill in the art.

SUMMARY

The disclosure provides a deposition device that can solve a defect of line patterns by controlling the magnetic force of the magnet to fix a deposition mask to a substrate in a deposition process.

A deposition device according to an embodiment may include a magnet portion including multiple magnets, and a substrate support that supports a substrate and faces the magnet portion. The substrate support may include multiple holes, and each of the holes may be disposed in the substrate support corresponding to a space between corresponding adjacent ones of the magnets.

The magnets may be arranged in a first direction, and the holes may be arranged in the first direction.

Each of the magnets may extend in a second direction, which is perpendicular to the first direction, and each of the holes may extend in the second direction.

A center of each of the holes may be aligned with a center of the space between the corresponding adjacent ones of the magnets.

A width of each of the holes in the first direction and a width of the space between the corresponding adjacent ones of the magnets in the first direction may be same.

A width of each of the holes in the first direction may be greater than a width of the space between the corresponding adjacent ones of the magnets in the first direction.

The substrate support may further include a first plane facing the magnet portion and a second plane that is opposite to the first plane, and the holes may be formed on the second plane.

A second direction may be perpendicular to the first direction, a third direction may be perpendicular to the first direction and the second direction, and a depth of each of the holes in the third direction may be less than a thickness of the substrate support in the third direction.

The substrate support may be disposed between the magnet portion and the substrate.

A pitch of the magnets in the first direction and a pitch of the holes in the first direction may be same.

The deposition device may further include a deposition mask disposed below the substrate. The substrate support may be disposed between the magnet portion and the deposition mask.

The substrate support may have a magnetic property.

The substrate support may include a refrigerant.

A deposition device according to an embodiment may include a magnet portion including multiple magnets arranged in a first direction, and a substrate support including a first plane facing the magnet portion and a second plane that is opposite to the first plane. The substrate support may have a magnetic property, and the substrate support may include multiple holes formed on the first plane or the second plane and arranged in the first direction.

Each of the magnet may extend in a second direction that is perpendicular to the first direction, and each of the holes may extend in the second direction.

A center of each of the holes may be aligned with a center of a space between corresponding adjacent ones of the magnets.

A width of each of the holes in the first direction may be equal to or greater than a width of the space between the corresponding adjacent ones of the magnets in the first direction.

A second direction may be perpendicular to the first direction, a third direction may be perpendicular to the first direction and the second direction, and a depth of each of the holes in the third direction may be less than a thickness of the substrate support in the third direction.

A substrate may be disposed on the second plane of the substrate support, and the substrate support may be disposed between the magnet portion and the substrate.

A deposition device according to an embodiment may include a magnet portion including multiple magnets, and a substrate support including a first plane facing the magnet portion and a second plane that is opposite to the first plane. The substrate support may include multiple holes that are formed on the first plane or the second plane and distort a magnetic force of the magnets.

According to the embodiments, the magnetic force of the magnets to fix a deposition mask to the substrate in the deposition process may be controlled, thereby solving a defect that line patterns are viewed.

DETAILED DESCRIPTION OF THE EMBODIMENTS

Figure 1:
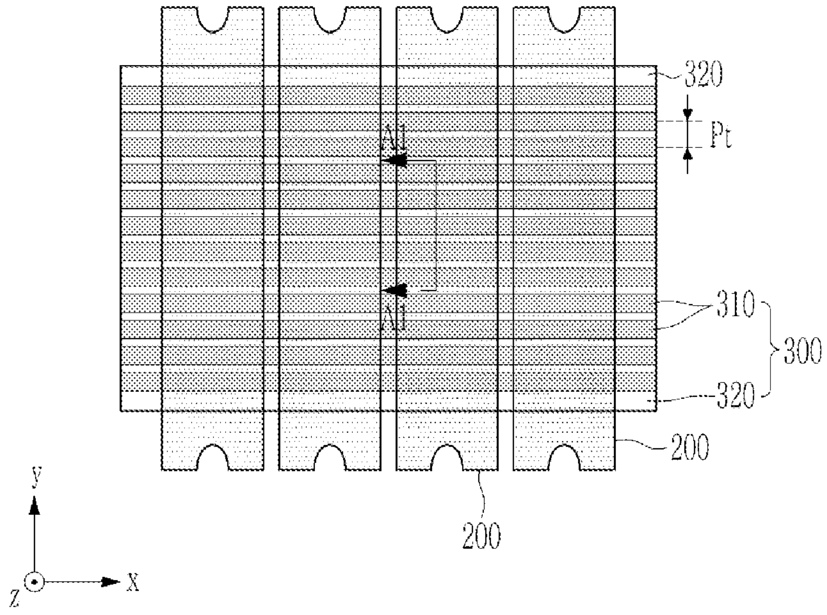
FIG. 1 is a top plan view that shows the arrangement of a magnet portion and a deposition mask included in a deposition device according to an embodiment.

Hereinafter, various embodiments of the disclosure will be described in detail with reference to the accompanying drawing, and thus a person of an ordinary skill in the technical field to which the disclosure belongs can readily perform it. The disclosure may be implemented in several different forms and is not limited to the embodiments described herein.

In order to clearly explain the disclosure, parts irrelevant to the description are omitted, and the same reference sign is designated to the same or similar constituent elements throughout the specification.

In addition, since the size and thickness of each component shown in the drawing are arbitrarily indicated for better understanding and ease of description, the disclosure is not necessarily limited to the drawings. In the drawings, the thickness of layers, films, panels, regions, and the like are exaggerated for clarity. In addition, in the drawing, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction. Also, when an element is referred to as being "in contact" or "contacted" or the like to another element, the element may be in "electrical contact" or in "physical contact" with another element; or in "indirect contact" or in "direct contact" with another element.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof.

Further, throughout the specification, the phrase "on a plane" or "in a plan view" means viewing a target portion from the top, and the phrase "on a cross-section" or "in a cross-sectional view" means viewing a cross-section formed by vertically cutting a target portion from the side.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a deposition device according to an embodiment will be described with reference to FIG. 1 to FIG. 4.

Figure 2:
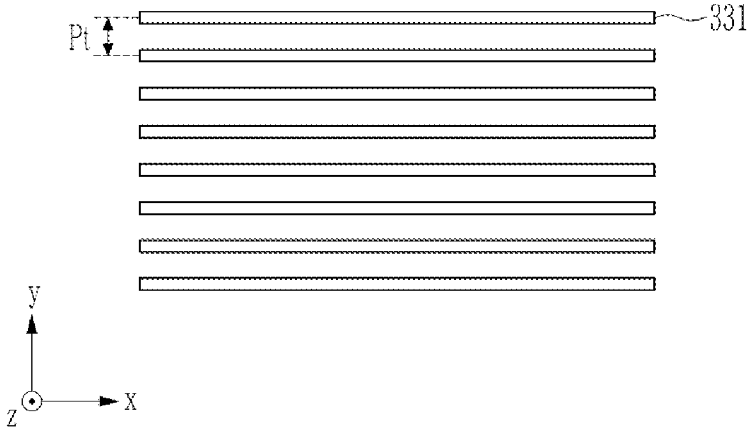
FIG. 2 is a top plan view that shows the arrangement of multiple holes of the substrate support included in the deposition device according to the embodiment.
Figure 3:
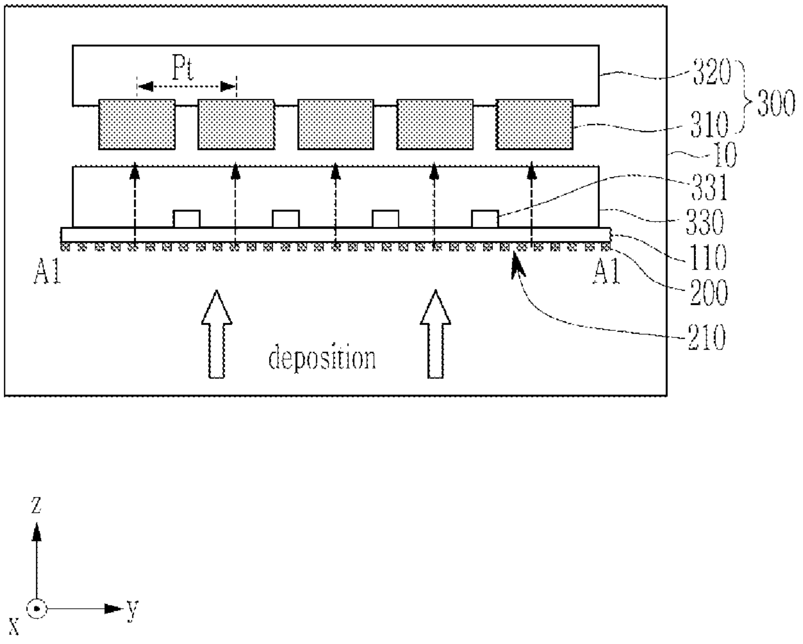
FIG. 3 is a schematic cross-sectional view of the deposition device in FIG. 1 according to the embodiment, taken along line A1-A1.

FIG. 1 is a top plan view that shows the arrangement of a magnet portion and a deposition mask included in a deposition device according to an embodiment, FIG. 2 is a top plan view that shows the arrangement of multiple holes of the substrate support included in the deposition device according to the embodiment, and FIG. 3 is a schematic cross-sectional view of the deposition device in FIG. 1 according to the embodiment, taken along line A1-A1.

Referring to FIG. 1 to FIG. 3, a deposition device according to an embodiment may include a chamber 10, a magnet portion 300, and a substrate support 330 for supporting a substrate 110.

Referring to FIG. 3, a deposition device according to an embodiment, for example, may deposit an organic layer for forming an emission layer of a light emitting element included in a pixel of a display device, and a deposition material may be deposited in the direction indicated by arrows shown in FIG. 3 in the chamber 10. The deposition material may include a variety of organic materials. The deposition material may be deposited in a region on the substrate 110 through an opening 210 of the deposition mask 200 that is closely attached to a lower portion of the substrate 110.

The magnet portion 300 may include multiple magnets 310 and a yoke plate 320.

Referring to FIG. 1, each magnet 310 may have a shape extended, for example, in an x direction. The magnets 310 may be arranged in a y direction that is orthogonal to the x direction. The adjacent magnets 310 may different polarities.

A y-directional pitch Pt of the magnets 310 may be a distance between a first surface of a first magnet disposed in the y direction and a first surface of a second magnet adjacent to the first magnet disposed in the y direction and corresponding to the first surface of the first magnet. A y-directional pitch Pt of the holes 331 may be a distance between a first surface of a first hole disposed in the y direction and a first surface of a second hole adjacent to the first hole disposed in the y direction and corresponding to the first surface of the first hole. The y-directional pitch Pt of the magnets 310 may be constant over the entire magnet portion 300, but is not limited thereto.

The yoke plate 320 may be for fixing the magnet 310, and may be in the form of a plate that is parallel to the x-direction and y-direction, for example, the xy plane. The yoke plate 320 may have magnetic force such that the magnet 310 can be fixed.

Referring to FIG. 1, the deposition mask 200 may be provided in a plurality, and the number of the deposition masks 200 is not limited. The deposition masks 200 may be arranged generally in the x direction.

Referring to FIG. 3, the substrate support 330 may be movable or fixed within the chamber 10. The substrate support 330 may face the magnet portion 300 and may be positioned between the magnet portion 300 and the substrate 110. A lower surface of the substrate support 330 may contact the substrate 110 and support the substrate 110. The substrate support 330 may be in the form of a plate that is parallel to the xy plane.

The substrate support 330 may include multiple holes (also called grooves) 331. The hole 331 may be formed on the surface of the substrate support 330 facing the substrate 110. For example, in case that a surface of the substrate support 330 facing the magnet portion 300 is referred to as an upper surface and a surface of the substrate support 330 opposite to the surface is referred to as a lower surface, the hole 331 may be formed on the lower surface of the substrate support 330. In the cross-sectional view shown in FIG. 3, each hole 331 may have a concave shape toward the inside of the substrate support 330. The cross-sectional shape of the hole 331 is illustrated as a rectangular shape in FIG. 3, but the shape of the hole 331 is not limited thereto. According to another embodiment, the cross-sectional shape of the hole 331 may be a semi-circle or a semi-ellipse, or may have various other shapes.

Referring to FIG. 2, each of the holes 331 of the substrate support 330 may have a shape extended in the x direction. The holes 331 may be arranged in the y direction. Referring to FIG. 2 and FIG. 3, a center of each hole 331 of the substrate support 330 may be approximately aligned with each center of a space between the adjacent magnets 310 included in the magnet portion 300. Accordingly, the y-direction pitch Pt of the holes 331 may be same as the y-direction pitch Pt of the magnets 310.

In case that the deposition mask 200 is disposed on the substrate 110 for the deposition process, the substrate 110 may be positioned between the substrate support 330 and the deposition mask 200. In case that the magnet portion 300 is disposed on the substrate 110 with the substrate support 330 interposed between the magnet portion 300 and the substrate 110, the deposition mask 200 may be fixed in close contact with the substrate 110 by the magnetic force of the magnet 310 of the magnet portion 300.

Figure 4:
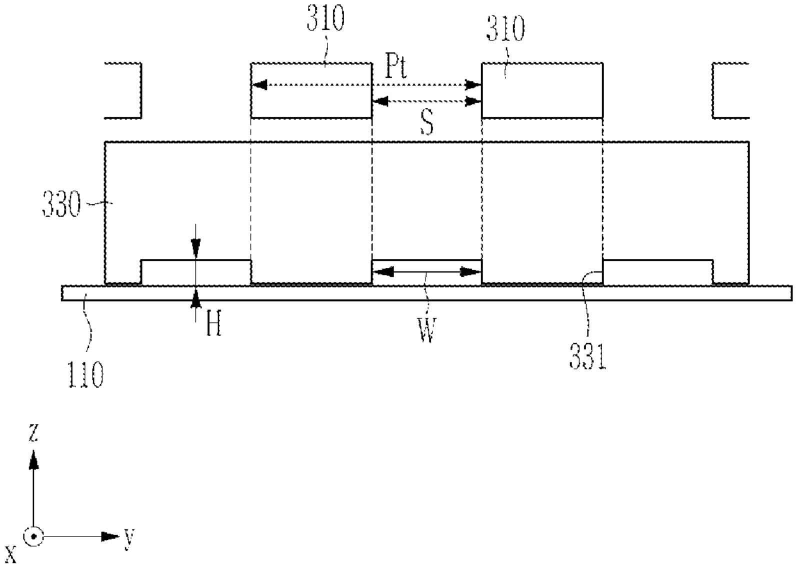
FIG. 4 is a schematic cross-sectional view of the substrate support included in the deposition device according to the embodiment.

FIG. 4 is a schematic cross-sectional view of the substrate support included in the deposition device according to the embodiment.

Referring to FIG. 4, the holes 331 formed on the substrate support 330 may be disposed to correspond to spaces between the adjacent magnets 310 among the magnets 310 of the magnet portion. A width W of the hole 331 in the y-direction may be same as or different from a width S of the space in the y-direction between the neighboring magnets 310. As described above, the y-direction pitch Pt of the magnets and the y-direction pitch Pt of the holes 331 of the substrate support 330 may be same.

A depth H of the hole 331 in a z-direction may be less than a thickness of the substrate support 330 in the z-direction. For example, the hole 331 formed on the substrate support 330 may not penetrate the substrate support 330 and may be formed with a predetermined (or selectable) depth on the surface facing the substrate 110 among the surfaces of the substrate support 330.

The substrate support 330 may have a magnetic property, for example, may include a metal such as stainless steel such as SUS304. The substrate support 330 may cool the substrate 110. For this, a refrigerant may circulate inside of the substrate support 330.

Referring to FIG. 5 to FIG. 14, together with FIG. 1 to FIG. 4, the effect of the display device according to the embodiment will be described together with a comparative example.

Figure 5:
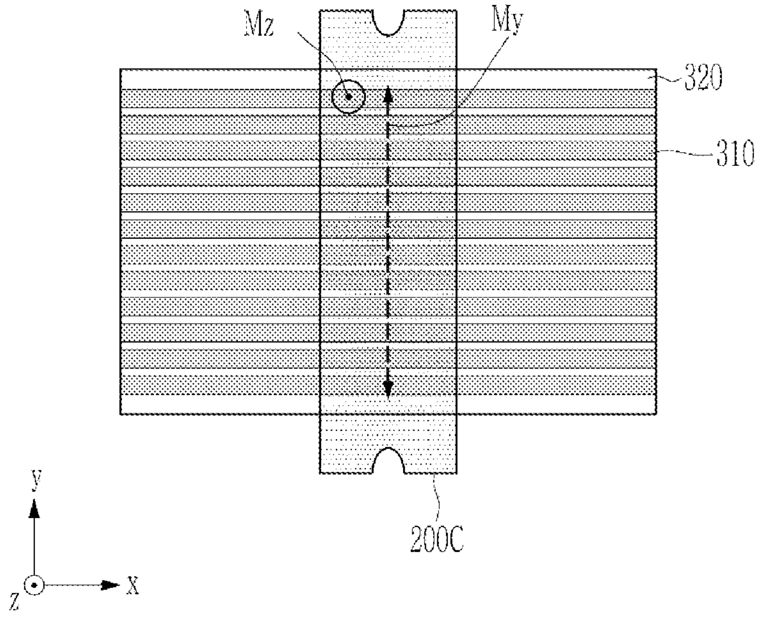
FIG. 5 is a top plan view of the magnet portion included in the deposition device according to a comparative embodiment.
Figure 6:
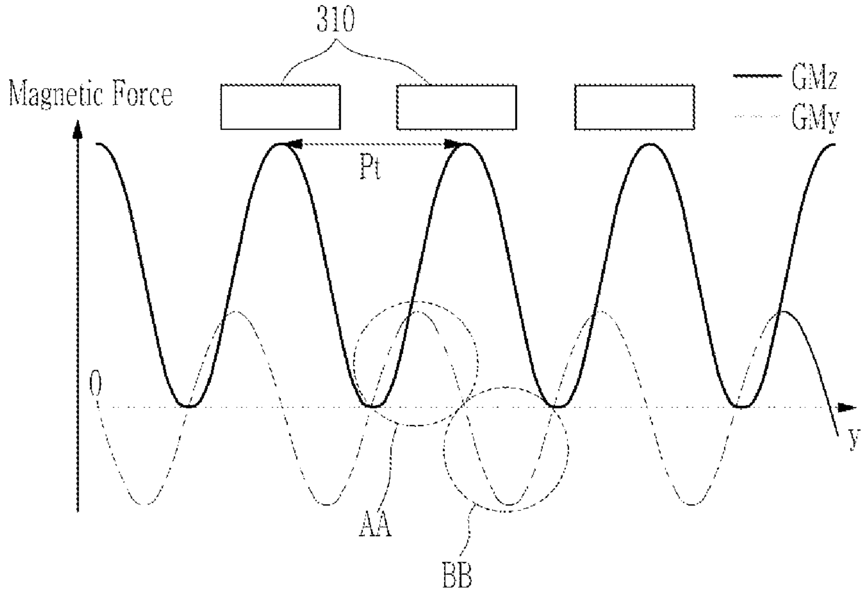
FIG. 6 is a graph that illustrates a magnetic force of a magnet portion included in a deposition device according to the comparative example.
Figure 7:
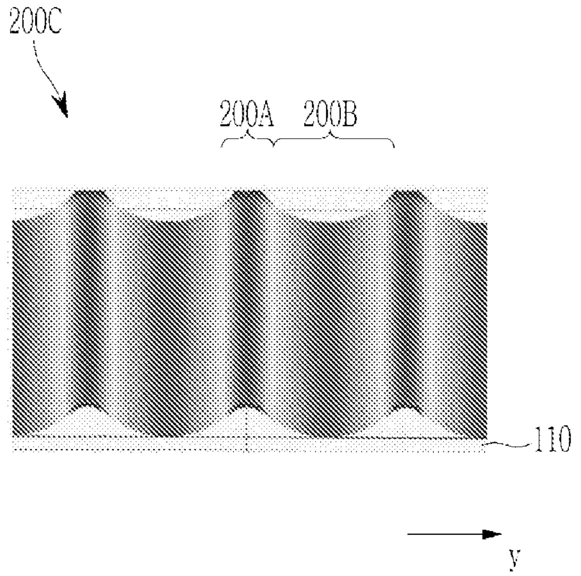
FIG. 7 is a simulation result of a deposition mask twisted by the magnetic force of the magnet portion included in the deposition device according to the comparative example.

FIG. 5 is a top plan view of the magnet portion included in the deposition device according to a comparative embodiment, FIG. 6 is a graph that illustrates a magnetic force of a magnet portion included in a deposition device according to the comparative example, and FIG. 7 is a simulation result of a deposition mask twisted by the magnetic force of the magnet portion included in the deposition device according to the comparative example.

Referring to FIG. 5 and FIG. 6, in a deposition device according to a comparative example, a substrate support does not include the hole 331 of the embodiment and has flat lower and upper surfaces.

FIG. 6 is a graph that shows an intensity of the magnetic force in y direction, and the first graph GMz represents a change of magnetic force Mz in the z-direction as shown in FIG. 5. The z-directional magnetic force Mz may change with the pitch Pt of the magnet 310 and may be the strongest at the center of each magnet 310. The first graph GMz has an upper peak at the center of each magnet 310 and a lower peak at the center of the space between the neighboring magnets 310, and may change generally in the form of a sine shape.

The second graph GMy shown in FIG. 6 represents a change of magnetic force My in the y direction as shown in FIG. 5. Although the y-directional magnetic force My also changes with the pitch Pt of the magnet 310 periodically, the y-directional magnetic force My has an upper peak at an edge of each magnet 310 and may be close to 0 at a center of each magnet 310. The second graph GMy has an upper peak at an edge of each magnet 310 and a lower peak at another edge of each magnet 310, and may change approximately in a sine shape. In FIG. 6, the direction of the y-directional magnetic force My in the region indicated by AA and the direction of the y-directional magnetic force My in the region indicated by BB may be opposite to each other.

According to the comparative example, the deposition mask 200C is changed (or deformed) into a wave shape that is periodically curved along the y direction by the z-directional magnetic force Mz and the y-directional magnetic force My that periodically change with upper and lower peaks, as shown in FIG. 7, and thus the deposition mask 200C may have a relatively sharp peak 200A and valley 200B.

As such, according to the comparative example in which the substrate support does not include a hole 331 as the embodiment, a periodic deviation may occur in a thickness of a film deposited on the substrate 110 by the z-directional magnetic force Mz and the y-directional magnetic force My that periodically change with upper and lower peaks and the deposition mask 200C that is changed (deformed) with a large curve in the z-direction by the magnetic forces My and Mz. Thus, a periodic deviation may occur in a thickness of an emission layer of the display device for each pixel column.

Figure 8:
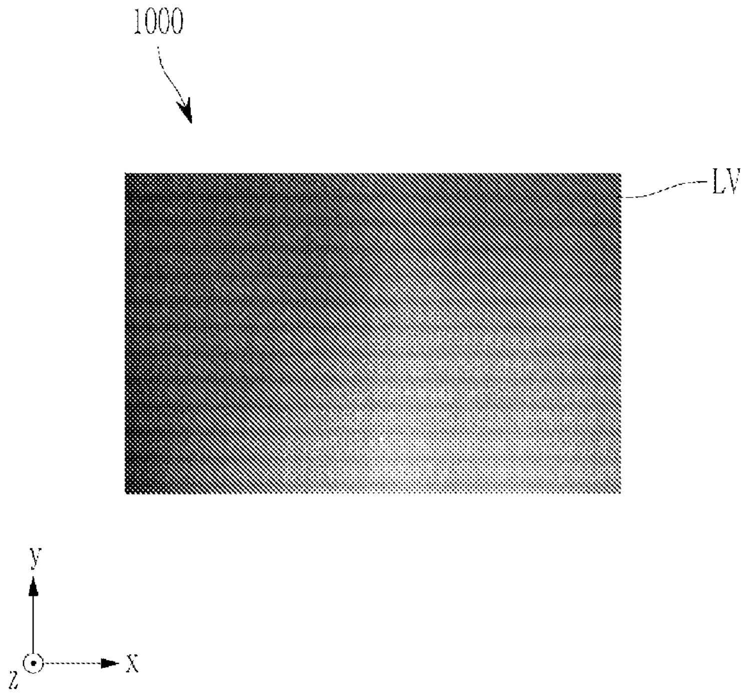
FIG. 8 is a photograph that shows an image having a defect of a horizontal stripe displayed by a display device manufactured using a deposition device according to the comparative example.

FIG. 8 is a photograph that shows an image having a defect of a horizontal stripe displayed by a display device manufactured using a deposition device according to the comparative example.

FIG. 8 shows a line pattern defect LV such as a horizontal stripe viewed in case that the display device 1000 in which a film is deposited with a deposition device on a substrate 110 according to the comparative example, displays white. Especially, as a thickness of the deposition mask 200C in the z-direction decreases recently, the thickness distribution of the deposition mask 200C becomes relatively large, and the deviation of magnetic force may become relatively large such that the defect in which the lines are viewed may become more severe.

Figure 9:
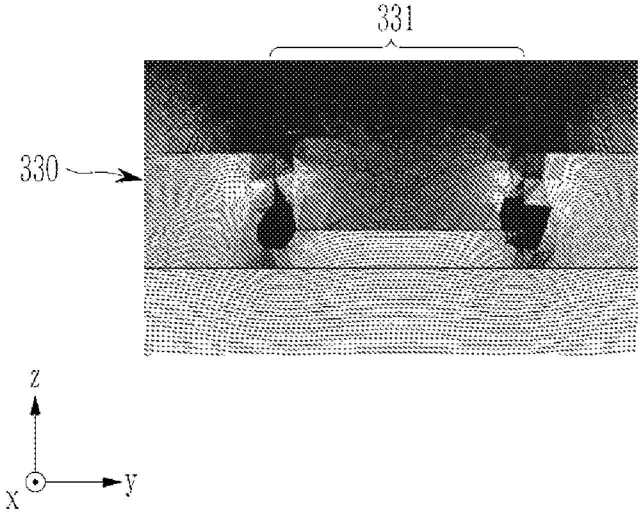
FIG. 9 is a simulation result that shows a magnetic force distorted by a substrate support included in a deposition device according to an embodiment.
Figure 10:
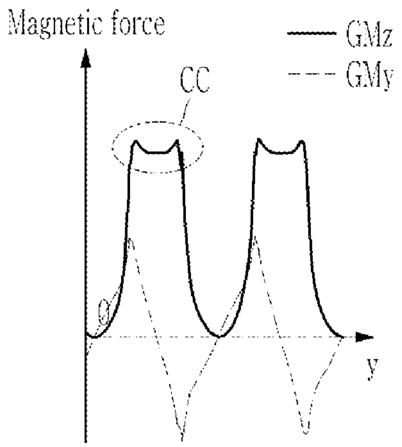
FIG. 10 is a graph that shows a result that a magnetic force of a magnet portion included in a deposition device according to an embodiment is changed by a substrate support.
Figure 11:
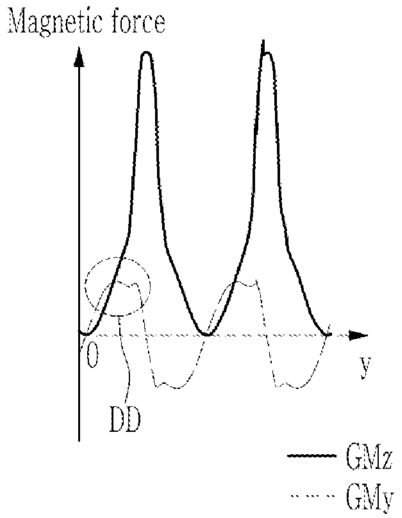
FIG. 11 is a graph showing a result that a magnetic force of a magnet portion included in a deposition device according to an embodiment is changed by a substrate support.
Figure 12:
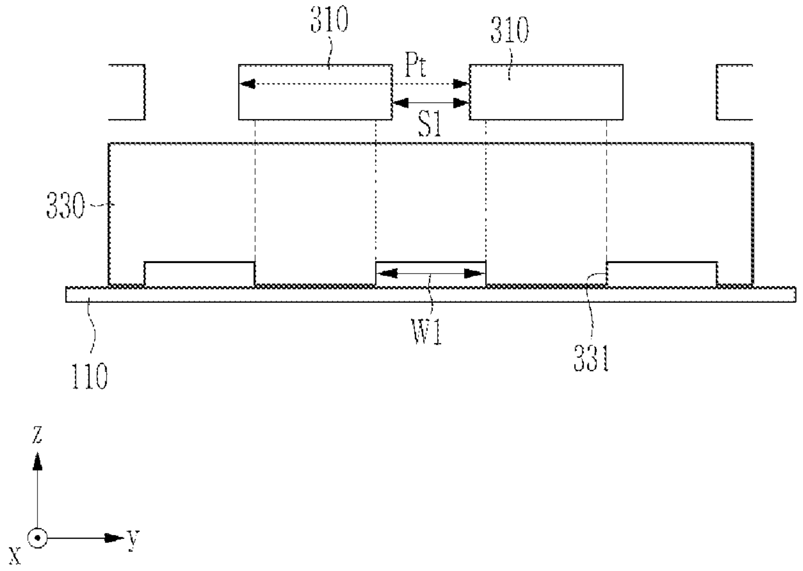
FIG. 12 is a schematic cross-sectional view of a substrate support included in a deposition device according to an embodiment.
Figure 13:
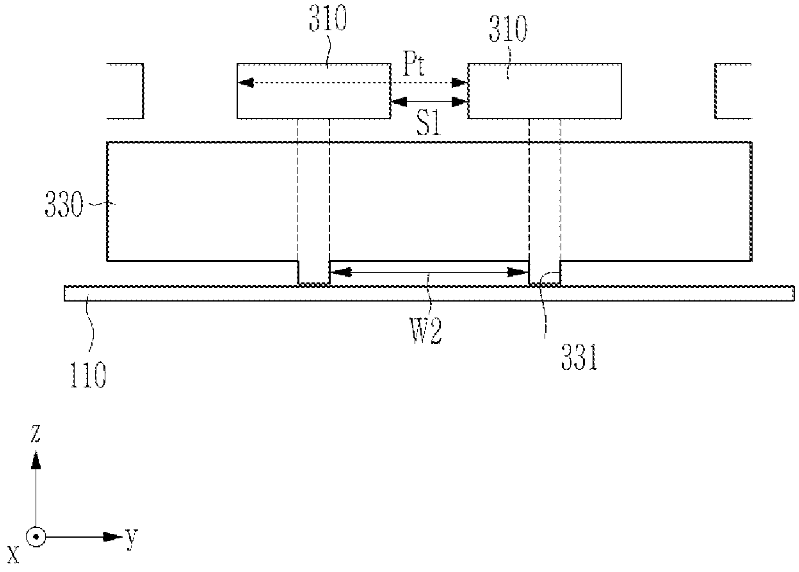
FIG. 13 is a schematic cross-sectional view of a substrate support included in a deposition device according to an embodiment.

FIG. 9 is a simulation result that shows a magnetic force distorted by a substrate support included in a deposition device according to an embodiment, FIG. 10 is a graph that shows a result that a magnetic force of a magnet portion included in a deposition device according to an embodiment is changed by a substrate support, FIG. 11 is a graph showing a result that a magnetic force of a magnet portion included in a deposition device according to an embodiment is changed by a substrate support, FIG. 12 is a schematic cross-sectional view of a substrate support included in a deposition device according to an embodiment, and FIG. 13 is a schematic cross-sectional view of a substrate support included in a deposition device according to an embodiment.

Compared to the comparative example described above, the substrate support 330 included in the deposition device according to the embodiment may have a magnetic property and may include multiple holes 331 corresponding to the space between the neighboring magnets 310, and as shown in FIG. 9, the magnetic force adjacent to the edge of the hole 331 formed on the substrate support 330 may be distorted.

As shown in the first graph GMz of FIG. 10, which is a graph representing an intensity of the magnetic force in the z direction, the z-directional magnetic force Mz may decrease in a region corresponding to the upper peak of the first graph GMz shown in FIG. 6 due to the magnetic force distortion adjacent to the edges of the holes 331 in the disclosure. Also, a width of a region having the highest z-directional magnetic force Mz in the y direction may increase as shown in the region indicated by CC in FIG. 10, and thus the first graph GMz that forms a flat peak compared to the first graph GMz of FIG. 6 may be obtained.

In another embodiment, as shown in the second graph GMy of FIG. 11, which is a graph representing an intensity of the magnetic force in the y direction, the y-directional magnetic force My may decrease in a region corresponding to the upper peak of the second graph GMy shown in FIG. 6 due to the magnetic force distortion adjacent to the edges of the holes 331 in the disclosure. Also, a width of a region having the highest y-directional magnetic force My in the y direction may increase as shown in the region indicated by DD in FIG. 11, and thus the second graph GMy that forms a flat peak compared to the second graph GMy of FIG. 6 may be obtained. It can be observed that the intensity of the magnetic force decreases and the width in the y direction increases even in a region where the y-directional magnetic force My is the lowest.

FIG. 10 and FIG. 11 may have the same effect of lowering the sharp peaks of the z-directional magnetic force Mz and the y-directional magnetic force My in the embodiment, respectively, and a difference may depend on a width of a hole 331 formed on a substrate support 330 as shown in FIG. 12 and FIG. 13.

Referring to FIG. 12, a hole 331 formed on a substrate support 330 according to an embodiment may be disposed corresponding to a space between the corresponding adjacent magnets 310 among multiple magnets 310 of a magnet portion. A width W1 of the hole 331 in the y direction may be greater than a width S1 of the space between the corresponding adjacent magnets 310 in the y direction. However, an edge of the hole 331 may not extend to a center of the corresponding magnet 310. For example, the W1 of the hole 331 in the y direction may be less than a pitch Pt of the magnet 310.

A graph that shows the intensity of the magnetic force according to the embodiment of FIG. 12 corresponds to the above-described FIG. 10.

Referring to FIG. 13, a hole 331 formed on a substrate support 330 according to an embodiment may be disposed corresponding to a space between the corresponding adjacent magnets 310 of a magnet portion. A width W2 of the hole 331 in the y direction may be greater than a width S1 of the space between the corresponding adjacent magnets 310 in the y direction, and greater than the width W1 of the hole 331 in the y direction according to the embodiment shown in FIG. 12. The width W2 of the hole 331 in the y direction may be less than a pitch Pt of the magnet 310.

A graph that shows the intensity of the magnetic force according to the embodiment of FIG. 13 corresponds to the above-described FIG. 11.

Figure 14:
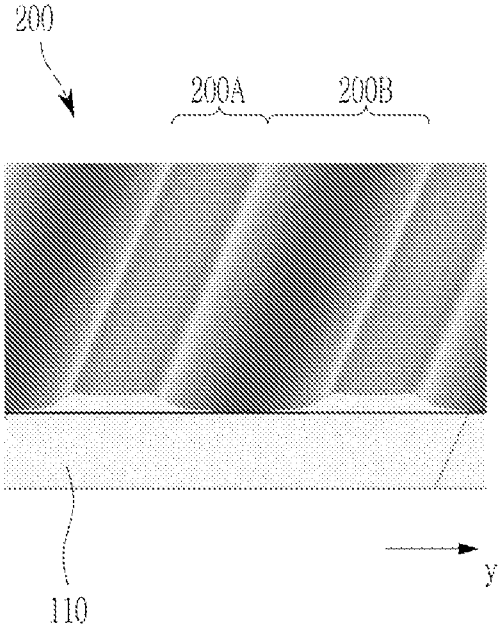
FIG. 14 is a simulation result of a deposition mask bent by a magnetic force of a magnet portion and a substrate support included in a deposition device according to an embodiment.

FIG. 14 is a simulation result of a deposition mask bent by a magnetic force of a magnet portion and a substrate support included in a deposition device according to an embodiment.

According to the embodiment, the intensity of a z-directional magnetic force Mz and a y-directional magnetic force My at a peak portion may decrease by a hole 331 of a substrate support 330, and a width in the y direction may increase, and thus it may reduce the effect of periodic magnetic force that affects a deposition mask 200. Referring to FIG. 14, the deposition mask 200 used in the deposition device according to the embodiment may have a periodic curved shape along the y direction, but compared to the shape of the deposition mask 200C according to the comparative example shown in FIG. 7, the deposition mask 200 in FIG. 14 may have flatter shape of which a height difference between a peak portion 200A and a valley portion 200B is smaller.

Thus, according to an embodiment where the substrate support 330 includes a hole 331, the magnetic force may be reduced and the degree of bending of the deposition mask 200 may be also reduced by distorting the peak portion of the z-directional magnetic force Mz and the y-directional magnetic force My. Accordingly, it may reduce deviation of a thickness of a film deposited on the substrate 110 by the deposition mask 200, thereby reducing defects in which line patterns are visually recognized.

According to embodiments, the hole 331 may be formed on a surface of the substrate support 330 facing the magnet portion 300. For example, in case that the surface facing the magnet portion 300 among the surfaces of the substrate support 330 is referred to as the upper surface and the opposite surface is referred to as the lower surface, the hole 331 may be formed on the upper surface of the substrate support 330.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments.

What is claimed is:

1. A deposition device comprising:

a magnet portion including a plurality of magnets arranged along a first direction; and a substrate support that supports a substrate and faces the magnet portion, wherein the substrate support comprises a plurality of holes, and each of the plurality of holes is disposed on the substrate support aligned with a space between corresponding adjacent ones of the plurality of magnets along a second direction orthogonal to the first direction.

2. The deposition device of claim 1, wherein the plurality of holes are arranged in the first direction.

3. The deposition device of claim 2, wherein each of the plurality of magnets extends in the second direction, and each of the plurality of holes extends in the second direction.

4. The deposition device of claim 2, wherein a center of each of the plurality of holes is aligned with a center of the space between the corresponding adjacent ones of the plurality of magnets.

5. The deposition device of claim 4, wherein a width of each of the plurality of holes in the first direction and a width of the space between the corresponding adjacent ones of the plurality of magnets in the first direction are the same.

6. The deposition device of claim 4, wherein a width of each of the plurality of holes in the first direction is greater than a width of the space between the corresponding adjacent ones of the plurality of magnets in the first direction.

7. The deposition device of claim 2, wherein the substrate support further comprises a first plane facing the magnet portion and a second plane that is opposite to the first plane, and the plurality of holes are formed on the second plane.

8. The deposition device of claim 2, wherein the second direction is perpendicular to the first direction, a third direction is perpendicular to the first direction and the second direction, and a depth of each of the plurality of holes in the third direction is less than a thickness of the substrate support in the third direction.

9. The deposition device of claim 2, wherein the substrate support is disposed between the magnet portion and the substrate.

10. The deposition device of claim 2, wherein a pitch of the plurality of magnets in the first direction and a pitch of the plurality of holes in the first direction are the same.

11. The deposition device of claim 2, further comprising:

a deposition mask disposed below the substrate, wherein the substrate support is disposed between the magnet portion and the deposition mask.

12. The deposition device of claim 2, wherein the substrate support has a magnetic property.

13. The deposition device of claim 1, wherein the substrate support includes a refrigerant.

14. A deposition device comprising:

a magnet portion including a plurality of magnets arranged in a first direction; and a substrate support including a first plane facing the magnet portion and a second plane that is opposite to the first plane, wherein the substrate support has a magnetic property, and the substrate support comprises a plurality of holes formed on the first plane or the second plane and arranged in the first direction.

15. The deposition device of claim 14, wherein each of the plurality of magnets extends in a second direction that is perpendicular to the first direction, and each of the plurality of holes extends in the second direction.

16. The deposition device of claim 14, wherein a center of each of the plurality of holes is aligned with a center of a space between corresponding adjacent ones of the plurality of magnets.

17. The deposition device of claim 16, wherein a width of each of the plurality of holes in the first direction is equal to or greater than a width of the space between the corresponding adjacent ones of the plurality of magnets in the first direction.

18. The deposition device of claim 14, wherein a second direction is perpendicular to the first direction, a third direction is perpendicular to the first direction and the second direction, and a depth of each of the plurality of holes in the third direction is less than a thickness of the substrate support in the third direction.

19. The deposition device of claim 14, wherein a substrate is disposed on the second plane of the substrate support, and the substrate support is disposed between the magnet portion and the substrate.

20. A deposition device comprising:

a magnet portion including a plurality of magnets arranged along a first direction; and a substrate support including a first plane facing the magnet portion and a second plane that is opposite to the first plane, wherein the substrate support comprises a plurality of holes that are formed on the first plane or the second plane, not aligned with the plurality of magnets of the magnet portion along a second direction orthogonal to the first direction, and configured to distort a magnetic force of the plurality of magnets.

* * * * *